United States Patent
Honda et al.

(10) Patent No.: US 9,445,027 B2
(45) Date of Patent: Sep. 13, 2016

(54) IMAGE SENSORS WITH COLUMN MEMORY REPAIR CIRCUITRY

(71) Applicant: Semiconductor Components Industries, LLC, Phoenix, AZ (US)

(72) Inventors: Hidenari Honda, Tokyo (JP); Shinichiro Matsuo, Kanagawa-ken (JP); Shusuke Iwata, Tokyo (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 129 days.

(21) Appl. No.: 14/185,542

(22) Filed: Feb. 20, 2014

(65) Prior Publication Data

US 2015/0237277 A1 Aug. 20, 2015

(51) Int. Cl.
*H04N 5/376* (2011.01)
*G11C 29/24* (2006.01)
*H04N 5/367* (2011.01)
*H04N 5/378* (2011.01)

(52) U.S. Cl.
CPC .............. *H04N 5/376* (2013.01); *G11C 29/24* (2013.01); *H04N 5/367* (2013.01); *H04N 5/378* (2013.01)

(58) Field of Classification Search
CPC ...... H04N 5/369; H04N 5/376; G11C 29/00; G11C 29/02; G11C 29/024; G11C 29/04; G11C 29/0401; G11C 29/0403; G11C 29/24; G11C 29/52; G11C 29/70; G11C 29/702; G11C 29/82; G11C 2029/3202
USPC ................ 348/241, 246, 247, 302, 303, 319
See application file for complete search history.

(56) References Cited

U.S. PATENT DOCUMENTS

| | | | | |
|---|---|---|---|---|
| 4,471,472 A | * | 9/1984 | Young ................. | G11C 29/846 365/200 |
| 5,231,604 A | * | 7/1993 | Watanabe ............ | G11C 29/846 365/189.05 |
| 7,554,589 B2 | * | 6/2009 | Boemler .............. | H04N 3/1568 250/208.1 |
| 8,275,213 B2 | | 9/2012 | Richardson | |
| 8,493,482 B2 | | 7/2013 | Cote et al. | |
| 8,717,838 B1 | * | 5/2014 | Mishi ..................... | G11C 29/70 365/185.09 |
| 2002/0118581 A1 | * | 8/2002 | Pitts ..................... | G11C 29/848 365/200 |
| 2009/0244328 A1 | * | 10/2009 | Yamashita ............ | H04N 5/357 348/241 |
| 2011/0058081 A1 | * | 3/2011 | Kim ..................... | H04N 5/3452 348/302 |
| 2012/0133794 A1 | * | 5/2012 | Silsby ................... | H04N 5/367 348/231.99 |
| 2013/0083204 A1 | | 4/2013 | Solhusvik et al. | |
| 2013/0173971 A1 | | 7/2013 | Zimmerman | |
| 2013/0346816 A1 | | 12/2013 | Menon et al. | |

* cited by examiner

*Primary Examiner* — Lin Ye
*Assistant Examiner* — Chriss Yoder, III
(74) *Attorney, Agent, or Firm* — Treyz Law Group, P.C.; Jason Tsai; Andrew C. Milhollin

(57) ABSTRACT

An image sensor may include an array of image pixels arranged in rows and columns. Each image pixel arranged along a column may be coupled to a pixel column line. Each pixel column line may be coupled to column memory circuitry via a respective analog-to-digital converter circuit. The column memory circuitry may include multiple column memory circuits, including a spare column memory circuit. If none of the column memory circuits are defective, the spare column memory circuit is idle. If one of the column memory circuits is defective, the spare column memory circuit is engaged to bypass the defective column memory circuit. Configured in this way, the column memory circuitry is provided with column-wise memory repair capabilities.

16 Claims, 7 Drawing Sheets

IMAGE SENSORS WITH COLUMN MEMORY REPAIR CIRCUITRY

BACKGROUND

This relates generally to imaging systems and, more particularly, to imaging systems that are provided with column memory test and repair circuitry.

Image sensors are commonly used in electronic devices such as cellular telephones, cameras, and computers to capture images. In a typical arrangement, an electronic device is provided with an array of image pixels arranged in pixel rows and pixel columns. Circuitry is commonly coupled to each pixel column for reading out image signals from the image pixels.

In a conventional arrangement, the pixel columns are connected to column memory circuitry. The column memory receives pixel signals from selected image pixels in the image pixel array and stores the received pixel signals. The column memory is sometimes used to implement correlated double sampling (CDS) and desired signal binning by combining the values of adjacent image pixels.

It is generally desirable to test the functionality of the column memory and to repair the column memory when a defect is detected. A typical column memory testing procedure involves performing row-wise column memory test and repair. Consider a scenario in which an image sensor under test includes 28 rows, where the first 23 bits in each column is normally in use, and where the remaining five bits are redundant bits used for repair. A first test is performed without repair to check if the first 23 rows exhibit any defects. If there is no defect, the sensor does not require any repair. If a defect is detected, a second test is performed on the five remaining redundant rows to help repair the defect. Passing redundant rows can then be used to substitute defective rows in the first 23 rows.

Performing row-wise column memory repair in this way may be time-consuming and costly. It would therefore be desirable to provide imaging systems with improved column memory repair capabilities.

DETAILED DESCRIPTION

Imaging systems having digital camera modules are widely used in electronic devices such as digital cameras, computers, cellular telephones, and other electronic devices. A digital camera module may include one or more image sensors that gather incoming light to capture an image.

In some situations, imaging systems may form a portion of a larger system such as a surveillance system or a safety system for a vehicle (e.g., an automobile, a bus, or any other vehicle). In a vehicle safety system, images captured by the imaging system may be used by the vehicle safety system to determine environmental conditions surrounding the vehicle. As examples, vehicle safety systems may include systems such as a parking assistance system, an automatic or semi-automatic cruise control system, an auto-braking system, a collision avoidance system, a lane keeping system (sometimes referred to as a lane drift avoidance system), etc.

In at least some instances, an imaging system may form part of a semi-autonomous or autonomous self-driving vehicle. Such imaging systems may capture images and detect nearby vehicles using those images. If a nearby vehicle is detected in an image, the vehicle safety system may sometimes operate a warning light, a warning alarm, or may activate braking, active steering, or other active collision avoidance measures. A vehicle safety system may use continuously captured images from an imaging system having a digital camera module to help avoid collisions with objects (e.g., other automobiles or other environmental objects), to help avoid unintended drifting (e.g., crossing lane markers) or to otherwise assist in the safe operation of a vehicle during any normal operation mode of the vehicle.

Image sensors may include arrays of image pixels. The pixels in the image sensors may include photosensitive elements such as photodiodes that convert the incoming light into electric charge. Image sensors may have any number of pixels (e.g., hundreds or thousands or more). A typical image sensor may, for example, have hundreds, thousands, or millions of pixels (e.g., megapixels).

Figure 1:
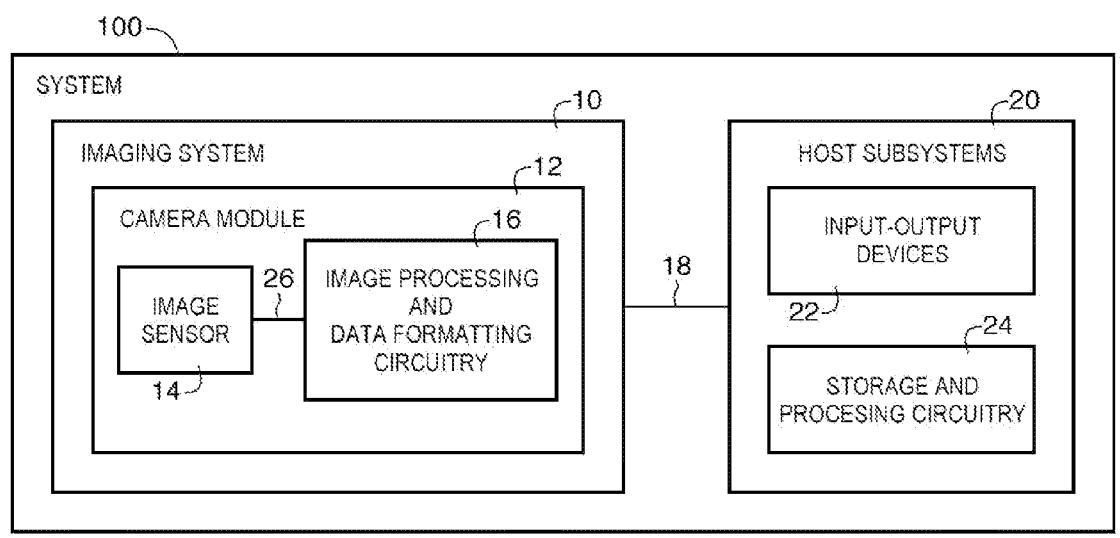
FIG. 1 is a diagram of an illustrative system that includes an imaging system and a host subsystem in accordance with an embodiment of the present invention.

FIG. 1 is a diagram of an illustrative imaging and response system including an imaging system that uses an image sensor to capture images. System 100 of FIG. 1 may be an electronic device such as a camera, a cellular telephone, a video camera, a vehicle safety system (e.g., an active braking system or other vehicle safety system), a surveillance system, or other electronic device that captures digital image data As shown in FIG. 1, system 100 may include an imaging system such as imaging system 10 and host subsystems such as host subsystem 20. Imaging system 10 may include camera module 12. Camera module 12 may include one or more image sensors 14 and one or more lenses. The lenses in camera module 12 may, as an example, include M*N individual lenses arranged in an M×N array. Individual image sensors 14 may be arranged in a corresponding M×N image sensor array (as an example). The values of M and N may each be equal to or greater than one, may each be equal to or greater than two, may exceed 10, or may have any other suitable values.

Each image sensor in camera module 12 may be identical or there may be different types of image sensors in a given image sensor array integrated circuit. During image capture operations, each lens may focus light onto an associated image sensor 14. Image sensor 14 may include photosensitive elements (i.e., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Still and video image data from image sensor 14 may be provided to image processing and data formatting circuitry 16 via path 26. Image processing and data formatting circuitry 16 may be used to perform image processing functions such as data formatting, adjusting white balance and exposure, implementing video image stabilization, face detection, etc. Image processing and data formatting circuitry 16 may also be used to compress raw camera image files if desired (e.g., to Joint Photographic Experts Group or JPEG format). In a typical arrangement, which is sometimes referred to as a system on chip (SOC) arrangement, camera sensor 14 and image processing and data formatting circuitry 16 are implemented on a common semiconductor substrate (e.g., a common silicon image sensor integrated circuit die). If desired, camera sensor 14 and image processing circuitry 16 may be formed on separate semiconductor substrates. For example, camera sensor 14 and image processing circuitry 16 may be formed on separate substrates that have been stacked.

Imaging system 10 (e.g., image processing and data formatting circuitry 16) may convey acquired image data to host subsystem 20 over path 18. Host subsystem 20 may include an active control system that delivers control signals for controlling vehicle functions such as braking or steering to external devices. Host subsystem 20 may include processing software for detecting objects in images, detecting motion of objects between image frames, determining distances to objects in images, filtering or otherwise processing images provided by imaging system 10. Host subsystem 20 may include a warning system configured to disable imaging system 10 and/or generate a warning (e.g., a warning light on an automobile dashboard, an audible warning, or other warning) in the event that verification data associated with an image sensor indicates that the image sensor is not functioning properly.

If desired, system 100 may provide a user with numerous high-level functions. In a computer or advanced cellular telephone, for example, a user may be provided with the ability to run user applications. To implement these functions, host subsystem 20 of system 100 may have input-output devices 22 such as keypads, input-output ports, joysticks, and displays and storage and processing circuitry 24. Storage and processing circuitry 24 may include volatile and nonvolatile memory (e.g., random-access memory, flash memory, hard drives, solid state drives, etc.). Storage and processing circuitry 24 may also include microprocessors, microcontrollers, digital signal processors, application specific integrated circuits, etc.

Figure 2:
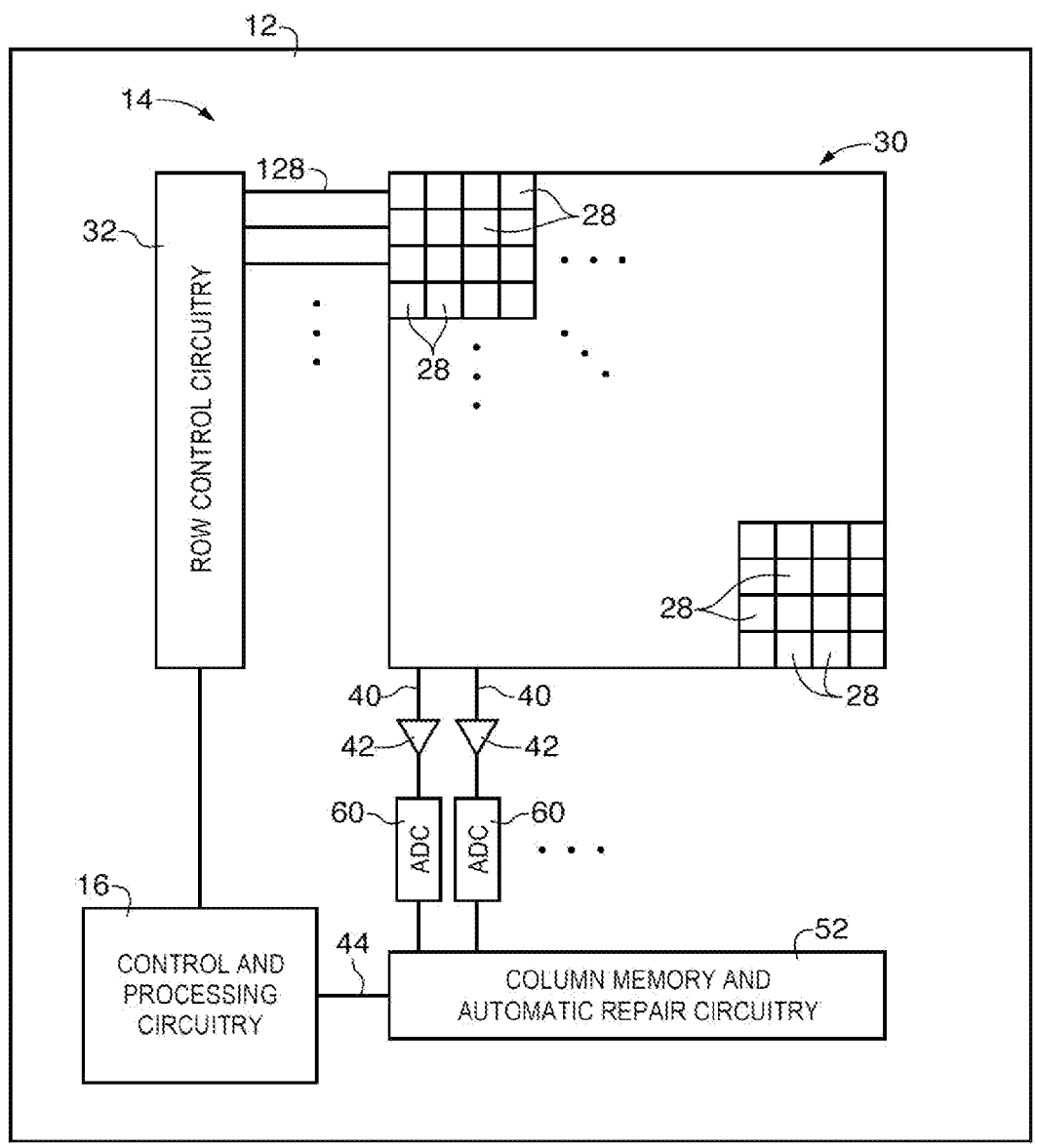
FIG. 2 is a diagram of an illustrative image sensor having an array of image pixels and control circuitry coupled to the array of image pixels in accordance with an embodiment of the present invention.

An example of an arrangement for camera module 12 is shown in FIG. 2. As shown in FIG. 2, camera module 12 includes image sensor 14 and control and processing circuitry 16. Image sensor 14 may include a pixel array such as array 30 of pixels 28. Control circuitry 16 may be coupled to row control circuitry 32 and global data path 44. Row control circuitry 32 may receive row addresses from control circuitry 16 and may supply corresponding row control signals to image pixels 28 over control paths 128. One or more conductive lines such as column lines 40 may be coupled to each column of image pixels 28 in image pixel array 30. Column lines 40 may be used for reading out image signals from image pixels 28 and for supplying bias signals (e.g., bias currents or bias voltages) to image pixels 28. During image pixel readout operations, a pixel row in image pixel array 30 may be selected using row control circuitry 32 and image data associated with image pixels 28 of that pixel row may be read out on column lines 40.

Array 30 may have any number of rows and columns. In general, the size of array 30 and the number of rows and columns in array 30 will depend on the particular implementation of image sensor 14. While rows and columns are generally described herein as being horizontal and vertical, respectively, rows and columns may refer to any grid-like structure (e.g., features described herein as rows may be arranged vertically and features described herein as columns may be arranged horizontally).

Row control circuitry 32 may generate signals on paths 128 as desired. For example, row control circuitry 32 may generate reset signals on reset control lines in paths 128, transfer signals on transfer control lines in paths 128, and row select (e.g., row readout) signals on row select control lines in paths 128 to control the operation of array 30. If desired, row control circuitry 32 and array 30 may be integrated together in a single integrated circuit (as an example).

Each column line 40 may be coupled to column circuitry such as a column amplifier 42 and an analog-to-digital converter (ADC) circuit 60. ADC circuits 60 may be used to convert analog signals on column lines 40 into corresponding digital signals. The converted digital signals from each column may be fed to column memory 52. Column memory 52 may serve to temporarily store the digital bits prior to readout (e.g., prior to outputting the bits to processing circuitry 16 via global data path 44).

It is possible that a small portion of column memory 52 be defective due to manufacturing faults. As a result, column memory 52 may be provided with associated automatic repair circuits. The automatic repair circuits may serve to perform tests on the column memory and to perform column-wise repair to fix defection portion(s) in response to detecting errors. The column memory and the repair circuits are sometimes referred to collectively as column memory and automatic repair circuitry 52.

Figure 3:
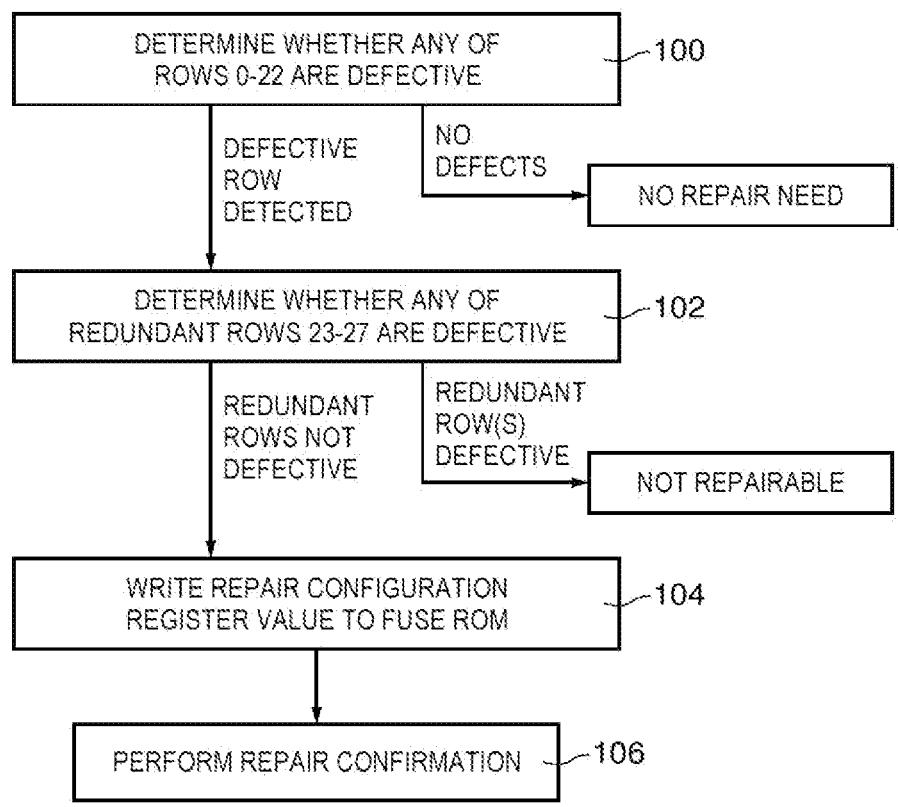
FIG. 3 is a flow chart showing conventional steps for performing column memory repair.

FIG. 3 is a flow chart of conventional steps involved in performing row-wise column memory repair for an image pixel array having 28 rows (i.e., rows indexed 0-27). At step 100, the repair circuitry determines whether any of rows 0-22 are defective. If none of rows 0-22 are defective, then no repair is needed. If at least one of these rows is defective, then processing proceeds to step 102.

At step 102, the repair circuitry determines whether any of rows 23-27 are defective. Rows 23-27 may serve as redundant rows that can be used for repair. If the redundant rows are defective, then the array is not repairable. If the redundant rows are not defective, then processing proceeds to step 104.

At step 104, a repair configuration register value corresponding to the current state of defects is written to a fuse read-only memory (ROM). Written in this way, some of the redundant rows may be configured to repair any one of defective rows 0-22. At step 106, repair confirmation operations may be performed to verify satisfactory column memory operation.

Performing manual row-wise column memory repair using the steps of FIG. 3 may be time consuming and costly. It would therefore be desirably to provide improved ways of performing column memory repair.

Figure 4:
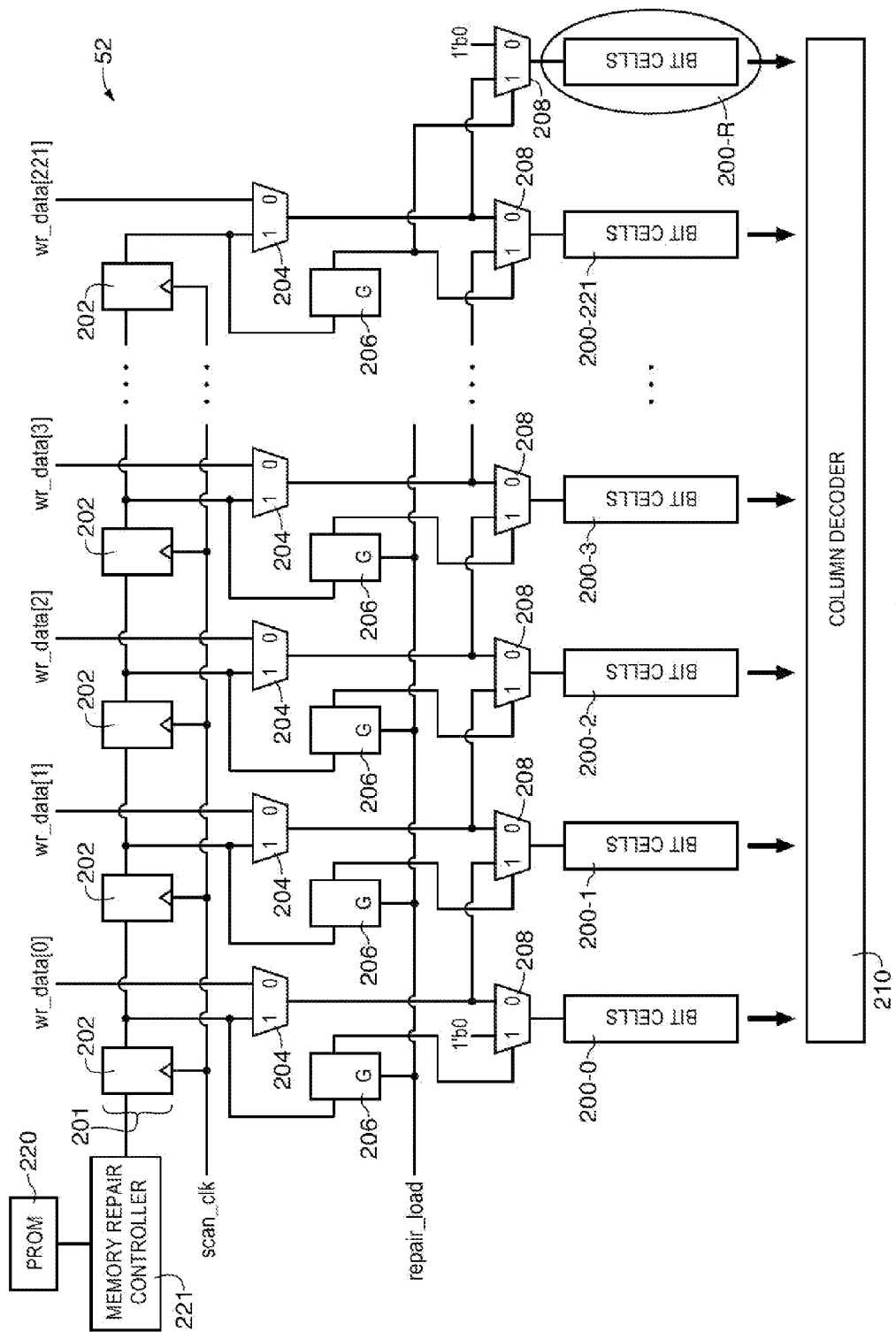
FIG. 4 is a diagram of illustrative column memory and repair circuitry in accordance with an embodiment of the present invention.

In accordance with an embodiment of the present invention, image sensor 14 may be provided with column memory and repair circuitry 52 that is capable of performing column-wise repair. FIG. 4 shows such type of circuitry 52. As shown in FIG. 4, circuitry 52 may include column memory circuits 200 (sometimes referred to as "bit-cells"), flip-flop circuits 202, multiplexers 204, latches 206, multiplexers 208, a column decoder 210, an associated repair storage element such as a programmable ROM 220 (e.g., a PROM such as a fuse ROM), and a memory repair controller 221.

The example of FIG. 4 assumes there are 222 columns in the image pixel array. As a result, column memory 52 includes a first column memory circuit 200-0, a second column memory circuit 200-1, a third column memory circuit 200-2, . . . , a $222^{nd}$ column memory circuit 200-221, and a redundant column memory circuit 200-R (sometimes referred to as the "spare" bit cells). Each of these column memory circuits 200 may be coupled to column decoder 210. Column memory circuits 200 may include a sufficient number of memory cells for storing the digital output from the corresponding ADC in each pixel column.

Each column memory circuit 200 may be coupled to a respective multiplexer 208. Multiplexer 208 may have an output that is coupled to the associated column memory circuit, a first (0) input, a second (1) input, and a control input. The first input of each multiplexer 208 in a column may be coupled to a corresponding multiplexer 204 in that column (e.g., multiplexer 208 may receive at its first input a signal from the output of multiplexer 204 in that column). The second input of each multiplexer 208 in a column may be coupled to the output of multiplexer 204 in a previous column and to the first input of multiplexer 208 in the previous column. The control input of each multiplexer 208 in a column may be coupled to a corresponding latch 206 in that column. In particular, the second input of multiplexer 208 associated with bit cells 200-0 may receive a logic zero, whereas the first input of multiplexer associated with redundant bit cells 200-R may receive a logic zero.

Each multiplexer 204 may have a first (0) input, a second (1) input, and an output on which signals from a selected one of the first and second inputs may be routed. As described above, the output of multiplexer 204 may be coupled to the first input of multiplexer 208 in the same column and the second input of multiplexer 208 in a subsequent column. The first input of multiplexer 204 may receive signal wr_data from an ADC 60 (FIG. 2). For example, multiplexer 204 in the first column may receive wr_data[0] from the ADC in that column; multiplexer 204 in the second column may receive wr_data[1] from the ADC in that column; . . . , and multiplexer 204 in the last column may receive wr_data [221] from the ADC in that column.

The second input of multiplexer 204 may receive signals from scan chain 201. Scan chain 201 may include flip-flop circuits 202 coupled in series in a chain, each of which is controlled by a clock signal scan_clk. The second input of each multiplexer 204 may be configured to receive an output signal from a respective flip-flop 202 in scan chain 201. Memory repair controller 221 may be connected to an input of scan chain 201. Memory repair controller 221 may be configured based on data stored in PROM 220. For example, memory repair controller 221 may be configured to generate an input pattern for scan chain 201 based on defective channel/column information stored in PROM 220.

Each latch 206 may have a data input that is coupled to the output of a respective flip-flop 202 in scan chain 201, a control input that is controlled by signal repair_load, and an output that is coupled to the control input of a corresponding multiplexer 208 in the same pixel column. Arranged as such, signal repair_load may be asserted to direct latch 206 to capture the scan chain output. If the latched scan chain output is low, the corresponding multiplexer 208 will be configured to route signals from its first input to its output.

If the latched scan chain output is high, the corresponding multiplexer 208 will be configured to route signals from its second input to its output. Note that multiplexer 208 associated with redundant bit cells 200-R has a control input that is coupled to the output of latch 206 in the last pixel column.

Figure 5:
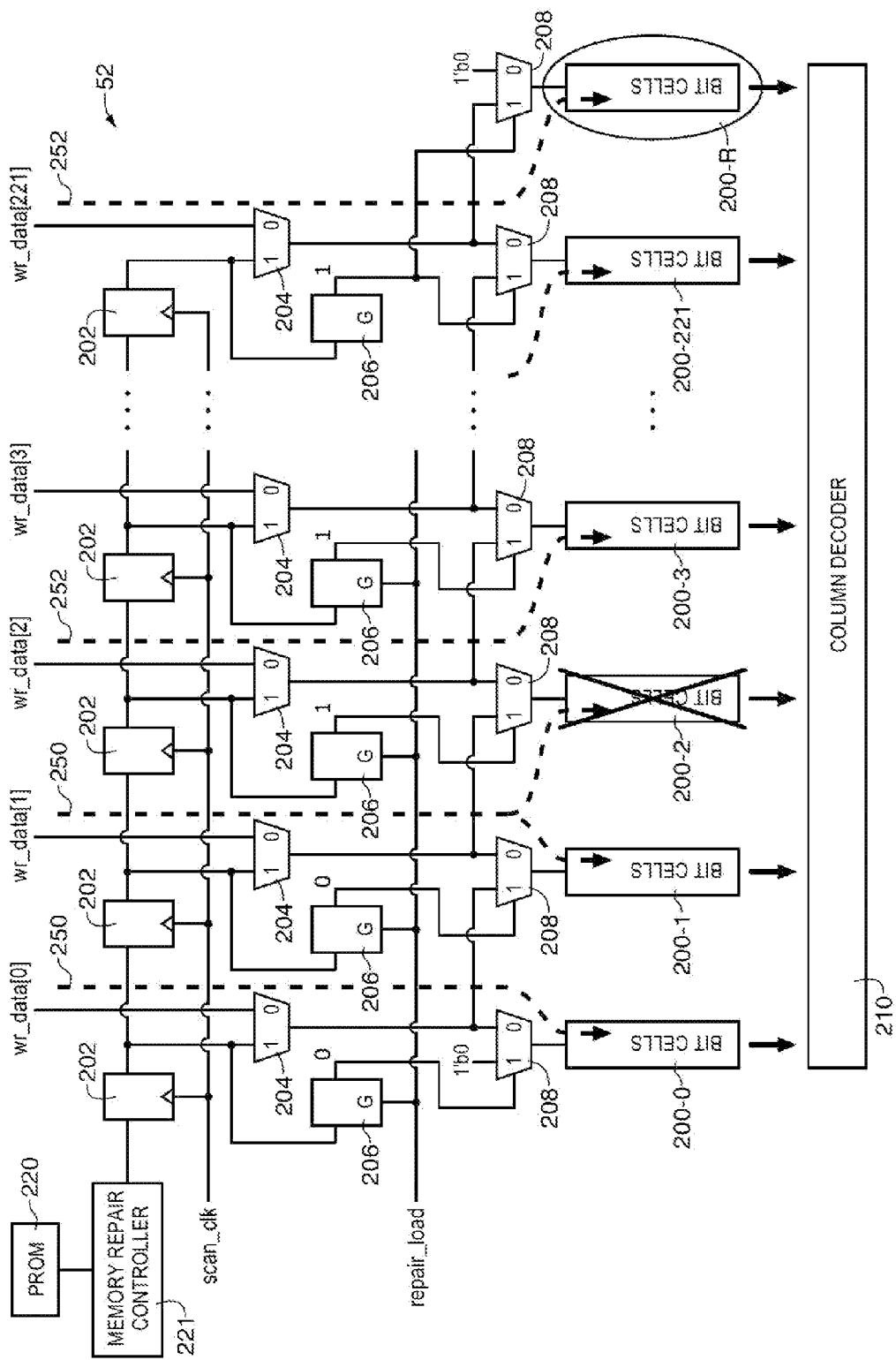
FIG. 5 is a diagram show how the column memory and repair circuitry of the type shown in FIG. 4 can be used to repair a defective column in accordance with an embodiment of the present invention.

Column memory circuitry 52 configured in the arrangement of FIG. 4 can be used to provide column-wise memory repair. FIG. 5 shows an example where bit cells 200-2 in the third column is defective and is switched out of use. As shown in FIG. 5, latches 206 in the first and second columns are configured to provide logic zeroes at their output so that the ADC output bits are passed straight through to the corresponding bit cells in the first and second columns, as indicated by dotted paths 250.

Latches 206 starting at the defective column (i.e., column three in this example), should be configured to provide logic ones at their output so that the ADC output bits are routed to the bit cells in the subsequent column. In other words, when the incoming ADC bits arrive at a defective column memory circuit, the arriving bits will be routed to the equivalent column memory circuit immediately following the defective column. In this way, the spare column memory circuit 200-R may be engaged to help repair circuitry 52.

As indicated by dotted paths 252, each successive column circuit after the defective column circuit may be shifted to the right by one column such that each column memory circuit replaces its logically equivalent column memory circuit in the immediate preceding column (e.g., so that columns 3, 4, 5, . . . , 221, and the spare column replace columns 2, 3, 4, . . . , and 221 that would have otherwise been in use if column 2 was not defective). This shifting of columns may be invisible to a user of the image sensor since the user only cares that there are 222 functional bit cell columns.

Configuring memory repair controller 221 to load a series of all zeros (e.g., when there are no defective columns) or to load a series of logic ones followed by a series of logic zeroes (e.g., when one defective column is detected) can therefore be implemented to effectively bypass the defective column by shifting each column after the defective column one position to the right so that each shifted column serves to replace the bit cell column immediately preceding that shifted column. In other words, the spare bit cells may be switched out of use when no columns are faulty, whereas the spare bit cells may be engaged to switch out a defective column when a fault is defected. Multiplexers 208 are therefore sometimes referred to as bypass circuits.

The circuit arrangement as shown in FIGS. 4 and 5 are merely illustrative and do not serve to limit the scope of the present invention. In general, column memory 52 may include any number of column memory circuits for receiving bits from a corresponding number of column ADC circuits. Other suitable ways for implementing a similar type of column-wise memory repair may be used, if desired.

Figure 6:
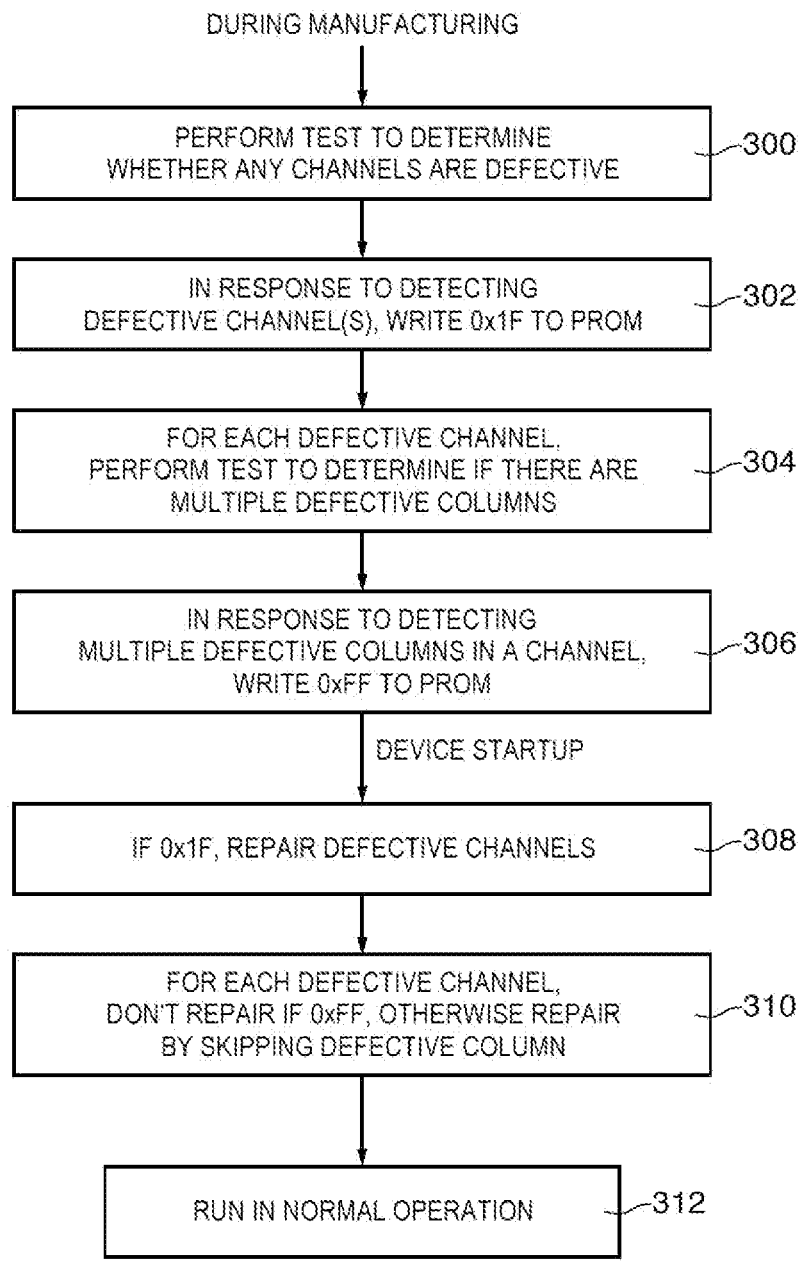
FIG. 6 is a flow chart of illustrative steps involved in performing column memory test and repair in accordance with an embodiment of the present invention.

FIG. 6 shows illustrative steps involved in performing column memory repair on image sensor 14. At step 300, a first series of tests may be performed to determine whether any channels on the image sensor are defective. The image sensor may be divided into different groups of pixel columns, each of which is sometimes referred to as a "channel." Each channel may include a number of column memory circuits (see, e.g., FIG. 4 shows one memory channel having 222 bit cell columns). In general, each channel has its own dedicated spare column that can be used for repair.

In response to detecting one or more defective channel(s), 0x1F may be loaded into a first location in the PROM (step 302). By reading out values at the first location in the PROM, one can determine whether the column memory includes any defective channels.

For each defective channel, a second series of tests can be performed to determine whether that channel has multiple defective columns (step 304). In response to detecting multiple defective columns in a channel, 0xFF may be loaded into a second location in the PROM (step 306). By reading out values at the second location in the PROM, one can determine whether a particular channel includes multiple defective channels. If desired, the values 0x1F and 0xFF described herein may initially appear in a separate read-only register during memory test. These values may then be written at a later point in time to the PROM.

Steps 300, 302, 304, and 306 may be performed during device manufacturing and assembly operations. For example, steps 300, 302, 304, and 306 may be performed at the same factory in which the image sensor is fabricated. The values at the first and second locations may be one-time programmed by selectively blowing/programming programmable switches in the PROM (e.g., the values loaded into the first and second locations are subsequently read-only entries). Once manufactured and assembled, the image sensor may be packaged and shipped to customers.

When a user receives the image sensor, the user may power up the device. Upon power up, the repair circuitry may read out values from the first PROM location. If 0x1F is retrieved, the defective channels may be repaired (step 308). If any other value is retrieved (e.g., 0x18-0x1E), column memory repair need not be performed.

For each defective channel, the repair circuitry may read out values from the second PROM location (step 310). If 0xFF is retrieved, no repair is performed and the sensor is marked as defective since the column memory repair circuitry only has one spare column and cannot repair multiple column defectives within a single channel. Otherwise, repair is performed by engagement the spare column bit cells to replace the defective column bit cells (e.g., by skipping the defective column).

After the defective column in each defective channel has been switched out of use, the column memory circuitry may be placed in normal user operations. The steps of FIG. 6 are merely illustrative and do not serve to limit the scope of the present invention. In general, the steps may be performed in any suitable order, and other steps may be performed between the described steps. If desired, steps 300, 302, 304, and 306 need not be performed only during manufacturing and can instead be performed during device startup. In the scenario in which the memory test performed during steps 300, 302, 304, and 306 is performed following every device startup, the defective channel/column information need not be written into a PROM to enable full-automatic column repair. If desired, other operations not described herein may also be performed to help implement the column-wise repair on circuitry of the type described in connection with FIGS. 4 and 5.

Figure 7:
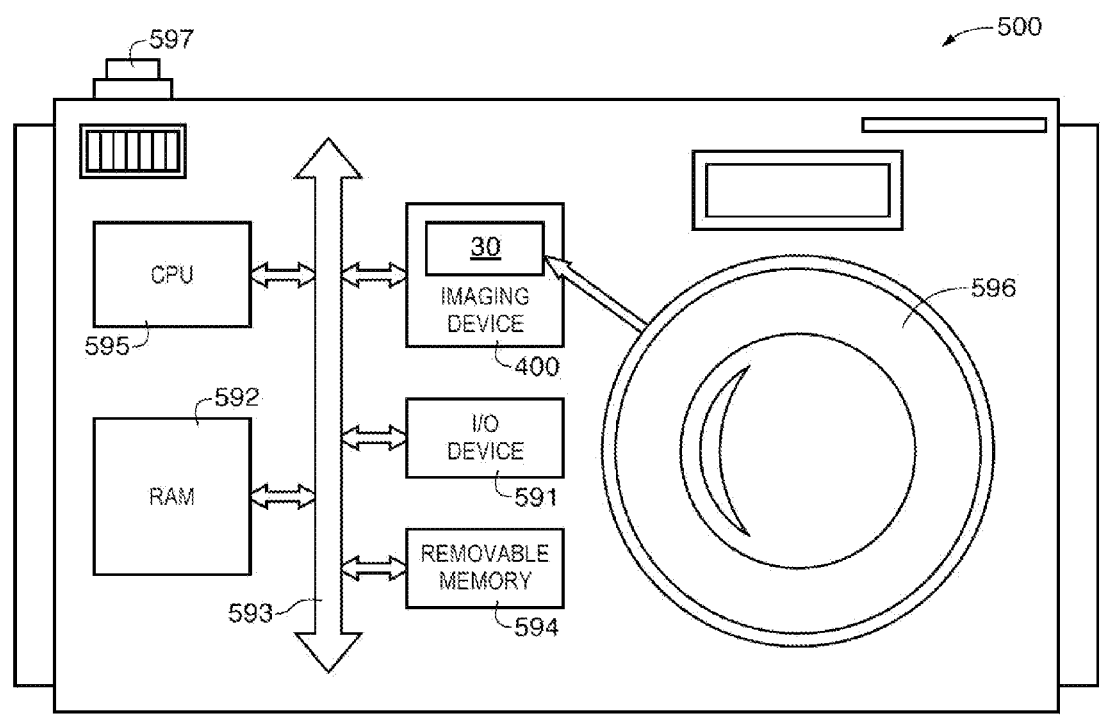
FIG. 7 is a block diagram of a system employing the embodiments of FIGS. 4-6 in accordance with an embodiment of the present invention.

FIG. 7 shows in simplified form a typical processor system 500, such as a digital camera, which includes an imaging device 400. Imaging device 400 may include a pixel array 30 having pixels of the type shown in FIG. 2 (e.g., pixel array 30 may be an array of image pixels 28) formed on an image sensor SOC. Processor system 500 is exemplary of a system having digital circuits that may include imaging device 400. Without being limiting, such a system may include a computer system, still or video camera system, scanner, machine vision, vehicle navigation, video phone, surveillance system, auto focus system, star tracker system, motion detection system, image stabilization system, and other systems employing an imaging device.

Processor system 500, which may be a digital still or video camera system, may include a lens such as lens 596 for focusing an image onto a pixel array such as pixel array 30 when shutter release button 597 is pressed. Processor system 500 may include a central processing unit such as central processing unit (CPU) 595. CPU 595 may be a microprocessor that controls camera functions and one or more image flow functions and communicates with one or more input/output (I/O) devices 591 over a bus such as bus 593. Imaging device 400 may also communicate with CPU 595 over bus 593. System 500 may include random access memory (RAM) 592 and removable memory 594. Removable memory 594 may include flash memory that communicates with CPU 595 over bus 593. Imaging device 400 may be combined with CPU 595, with or without memory storage, on a single integrated circuit or on a different chip. Although bus 593 is illustrated as a single bus, it may be one or more buses or bridges or other communication paths used to interconnect the system components.

Various embodiments have been described illustrating an imaging system (see, e.g., system 100 of FIG. 1) including an imaging system and host subsystems. An imaging system may include one or more image sensors. Each image sensor may include an array of image pixels formed on a semiconductor substrate. Each image pixel may include one or more photosensitive elements configured to convert incoming light into electric charges.

An image sensor may include an array of image sensor pixels arranged in rows and columns. The array of image sensor pixels may be coupled to multiple pixel column lines, each of which is coupled to image sensor pixels arranged along a respective column in the array. The pixel column lines may be coupled to column memory and repair circuitry via analog-to-digital converter circuitry.

The column memory and repair circuitry may be configured to implement column-wise repair. In particular, the column memory may include multiple bit cell columns, each of which receives bits from a corresponding pixel column line. The column memory may also include a spare bit cell column. When none of the bit cell columns are defective, the spare bit cell column is idle. When one of the bit cell columns is defective, the spare bit cell column may be engaged to bypass/skip the defective bit cell column.

The column memory and repair circuitry may also include multiplexing and scan chain circuits for controlling how pixel values from the pixel column lines are routed to the different bit cell columns. For example, when no column repair is needed, the scan chain may be loaded with identical values (e.g., all logic zeroes), whereas when column repair is needed, the scan chain may be loaded with different values (e.g., a series of logic ones followed by a series of logic zeroes). The particular repair configuration bits may be stored in a programmable storage element (e.g., a fuse ROM). The programmable ROM may be programmed during manufacturing operations so that defective columns will be automatically bypassed during normal device operation.

The foregoing is merely illustrative of the principles of this invention and various modifications can be made by those skilled in the art. The foregoing embodiments may be implemented individually or in any combination.

Although the invention has been described in some detail for the purposes of clarity, it will be apparent that certain changes and modifications can be practiced within the scope of the appended claims. Although some of the appended claims are single dependent only or reference only some of their preceding claims, their respective feature(s) can be combined with the feature(s) of any other claim.

What is claimed is:

1. An image sensor, comprising:
an array of image sensor pixels arranged in rows and columns;
a plurality of pixel column lines, each of which is coupled to image sensor pixels arranged along a respective column in the array;
analog-to-digital converter circuitry interposed in the plurality of pixel column lines, wherein the analog-to-digital converter circuitry is directly connected to one of the plurality of pixel column lines; and
column memory and repair circuitry, wherein the column memory and repair circuitry receives pixel signals from the plurality of pixel column lines and stores the received pixel signals into corresponding column memory circuits in the column memory and repair circuitry, wherein the column memory and repair circuitry implements column-wise repair by selectively bypassing a defective column memory circuit in the column memory circuits, wherein the analog-to-digital converter circuitry is interposed between the image sensor pixels and the column memory and repair circuitry, and wherein the column memory and repair circuitry comprises:
a plurality of multiplexers each of which is coupled to a respective one of the column memory circuits; and
a scan chain coupled to inputs of the plurality of multiplexers, wherein the scan chain comprises a plurality of flip-flop circuits controlled by a clock signal.

2. The image sensor defined in claim 1, wherein the scan chain configures the plurality of multiplexers to bypass the defective column memory circuit.

3. The image sensor defined in claim 2, wherein the column memory and repair circuitry further comprises:
a memory repair controller coupled to an input of the scan chain; and
programmable read-only memory containing information for configuring the memory repair controller.

4. The image sensor defined in claim 2, wherein the column memory and repair circuitry further comprises:
a plurality of latches, each of which has an input coupled to the scan chain and an output coupled to a respective multiplexer in the plurality of multiplexers.

5. The image sensor defined in claim 1, further comprising:
a column decoder coupled to the column memory circuits.

6. A method of operating an image sensor that includes an array of image sensor pixels arranged in rows and columns, the method comprising:
with a selected row of image sensor pixels in the array, outputting pixel signals onto respective column lines;
with analog-to-digital converter circuitry directly connected to the column lines, receiving the pixel signals from the column lines and outputting converted pixel signals;
with column memory and repair circuitry, receiving the converted pixel signals from the analog-to-digital converter circuitry and implementing column-wise repair by selectively bypassing a defective bit cell column in the column memory and repair circuitry, wherein the column and memory and repair circuitry includes a plurality of bit cell columns;
in response to determining that multiple bit cell columns in the plurality of bit cell columns are defective, writing a predetermined value into a programmable storage element in the column memory and repair circuitry;
storing a read out value in the programmable storage element; and
in response to determining that the read out value is not equal to the predetermined value, repairing the plurality of bit cell columns.

7. The method defined in claim 6, wherein receiving the converted pixel signals from the analog-to-digital converter circuitry comprises receiving the converted pixel signals from respective column lines with at least a portion of the plurality of bit cell columns.

8. The method defined in claim 7, further comprising:
testing the column memory and repair circuitry to determine whether multiple bit cell columns in the plurality of bit cell columns are defective.

9. The method defined in claim 8, wherein the plurality of bit cell columns includes a spare bit cell column, and wherein repairing the plurality of bit cell columns comprises engaging the spare bit cell column to switch the defective bit cell column out of use.

10. The method defined in claim 8, wherein the column memory and repair circuitry further includes a scan chain, the method further comprising:
using the scan chain to control how the converted pixel signals on the column lines are being routed to the plurality of bit cell columns.

11. The method defined in claim 8, further comprising:
in response to determining that the read out value is equal to the predetermined value, loading a series of logic zeroes into the scan chain; and
in response to determining that the read out value is not equal to the predetermined value, repairing the plurality of bit cell columns by loading a series of logic ones followed by a series of zeroes into the scan chain.

12. A system, comprising:
a central processing unit;
memory;
a lens;
input-output circuitry; and
an imaging device, wherein the imaging device comprises:
a pixel array having a plurality of image pixels arranged in rows and columns;
column memory circuitry that is coupled to the pixel array and that is configured to implement column-wise memory repair, wherein the column memory circuitry comprises:
a plurality of bit cell columns; and
multiplexing circuitry, wherein the multiplexing circuitry comprises:
a first multiplexer that receives a column signal from the pixel array; and
second and third multiplexers that each receive an output of the first multiplexer and that each have an output coupled to a respective bit cell column of the plurality of bit cell columns.

13. The system defined in claim 12, wherein the multiplexing circuitry bypasses a defective bit cell column in the plurality of bit cell columns.

14. The system defined in claim 13, wherein the column memory circuitry further comprises:
a spare bit cell column that is idle when there are no defective bit cell columns in the plurality of bit cell columns and that is engaged when a defective bit cell column is detected.

15. The system defined in claim 13, wherein the column memory further comprises:
 a scan chain that controls how pixel signals from the pixel array are routed to the plurality of bit cell columns.

16. The system defined in claim 15, wherein the scan chain is configured to store identical values when there are no defective bit cells in the plurality of bit cell columns and to store different values when a defective bit cell column is detected.

* * * * *